United States Patent
Kanaya

(10) Patent No.: US 8,018,692 B2
(45) Date of Patent: Sep. 13, 2011

(54) THIN FILM MAGNETIC HEAD AND METHOD OF MANUFACTURING THE SAME

(75) Inventor: Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 430 days.

(21) Appl. No.: 12/318,925

(22) Filed: Jan. 13, 2009

(65) Prior Publication Data

US 2010/0177441 A1    Jul. 15, 2010

(51) Int. Cl.
  G11B 5/33   (2006.01)
  G11B 5/48   (2006.01)
  G11B 5/60   (2006.01)
(52) U.S. Cl. .............. 360/324.12; 360/234.3; 360/245.3
(58) Field of Classification Search ............. 360/324.12, 360/245.3, 234.3
See application file for complete search history.

(56) References Cited

FOREIGN PATENT DOCUMENTS

| | | |
|---|---|---|
| JP | A-2006-86275 | 3/2006 |
| JP | A-2007-250085 | 9/2007 |

*Primary Examiner* — Ly D Pham
(74) *Attorney, Agent, or Firm* — Posz Law Group, PLC

(57) ABSTRACT

A thin film magnetic head has a magneto-resistive (MR) effect element including an MR effect film formed by sequentially layering a magnetic pinned layer, a nonmagnetic layer and a free layer, and a pair of bias magnetic field application layers formed at junction tapered parts formed on both end parts of the magneto-resistive effect film in the width direction via insulating layers. Further, magnetic pinned layer oxidized films whose thickness is Hx (unit: nm) are disposed on end parts of the magnetic pinned layer at the junction tapered parts, free layer oxidized films whose thickness is Hf (unit: nm) are disposed on end parts of the free layer at the junction tapered parts, and the oxidized films are configured such that the thickness ratio (Hx/Hf) is not more than 0.5. With this configuration, the bias magnetic filed application layers effectively apply a vertical bias magnetic filed to the free layer, resulting in that the thin film magnetic head is realized having a large MR ratio, a small deviation σ of MR waveform asymmetry, and excellent reliability.

13 Claims, 10 Drawing Sheets

THIN FILM MAGNETIC HEAD AND METHOD OF MANUFACTURING THE SAME

BACKGROUND OF THE INVENTION

1. Field of the Invention

The present invention relates to a thin film magnetic head including a magneto-resistive effect element for reading a magnetic field intensity of a magnetic recording medium or the like as signals, as well as a method of manufacturing the same.

2. Description of the Related Art

As the surface recording density of a magnetic disk device has lately been advanced, there is a need for enhancing the performance of a thin film magnetic head. As a thin film magnetic head, a complex type thin film magnetic head has widely been used that has a structure of a reproducing head having a read-only magneto-resistive (MR) effect element (hereinafter also referred to as an MR element) and a recording head having a write-only magnetism conversion element layered on a substrate.

MR elements include an anisotropic magneto-resistive (AMR) element using the AMR effect, a giant magneto-resistive (GMR) element using the GMR effect and a tunnel magneto-resistive (TMR) element using the TMR effect.

The characteristics of a reproducing head should particularly be high sensitivity as well as high output. As a reproducing head that satisfies such requirements, a GMR head using a spin-valve type GMR element has already been mass-produced.

Moreover, a GMR element having a structure that allows a sense current to flow in the perpendicular direction (layering direction) relative to the surface of each layer constituting the GMR element, that is, a current perpendicular to plane (CPP) structure (a CPP-MR element) has been developed as a next generation element. A TMR element that has already been mass-produced and put into practical use falls under the category of CPP-MR elements as well.

An MR element is placed between upper and lower shield layers formed of soft magnetic metal films and is disposed in a manner of being sandwiched between insulating layers referred to as gap layers. The recording density of bit direction is defined by a shield gap (also known as read gap length) between the upper and lower shield layers. As the recording density has lately increased, there is an increased need for a narrow shield gap or narrow track for the reproducing element of a reproducing head.

In the thin film magnetic head containing such a magneto-resistive effect element, a bias magnetic field application layer is disposed on each of two sides of an MR element. This bias magnetic application layers allow application of a so-called vertical bias to a free layer constituting part of the element. As a result, the generation of noise can be suppressed, thus allowing the operation of detecting a predetermined external magnetic field.

As described above, however, the shield gap of an element has rapidly been narrowed. Accordingly, there is a need for novel thin film magnetic head structures that allow a vertical bias magnetic field to be efficiently applied to a free layer from a bias magnetic field application layer having a limited volume.

The prior art similar to or related to the present invention that allows efficient application of a vertical bias magnetic field to a free layer from a bias magnetic field application layer includes Japanese Laid-Open application number 2006-86275 and Japanese laid-open application number 2007-250085.

However, there are limits of effects to be achieved because the shape of an element or bias magnetic field application layer is designed or controlled in such conventional proposals. Accordingly, there remains a need for original technologies based on totally new ideas instead of technologies that are an extrapolation of the prior art.

The present invention was made in these circumstances. The object of the present invention is to provide a new thin film magnetic head structure that allows efficient application of a vertical bias magnetic field to a free layer from a bias magnetic field application layer.

SUMMARY OF THE INVENTION

In order to solve the abovementioned problems, a thin film magnetic head of the present invention includes a magneto-resistive (MR) effect element comprising: an MR effect film formed by sequentially layering a magnetic pinned layer, a nonmagnetic layer and a free layer; and a pair of bias magnetic field application layers formed at junction tapered parts formed on both end parts of the MR effect film in a width direction via insulating layers, wherein the free layer is configured to change its magnetization direction in accordance with an external magnetic field, a magnetization direction of the magnetic pinned layer is pinned, and the bias magnetic field application layers are configured to apply a vertical bias magnetic field to the free layer, wherein magnetic pinned layer oxidized films whose thickness is Hx (unit: nm) are disposed on end parts of the magnetic pinned layer at the junction tapered parts, free layer oxidized films whose thickness is Hf (unit: nm) are disposed on end parts of the free layer at the junction tapered parts, and the oxidized films are configured such that the thickness ratio (Hx/Hf) is not more than 0.5.

Another preferred embodiment of the thin film magnetic head of the present invention, the thickness Hx (unit: nm) of the magnetic pinned layer oxidized film is in the range of 0.6~2 nm.

Another preferred embodiment of the thin film magnetic head of the present invention, no free layer oxidized film substantially exists on the end parts of the free layer at the junction tapered parts.

Another preferred embodiment of the thin film magnetic head of the present invention, a thickness of the bias magnetic field application layers is in the range of 12~20 nm.

Another preferred embodiment of the thin film magnetic head of the present invention, the bias magnetic field application layers are configured of a Co system hard magnetic layer.

Another preferred embodiment of the thin film magnetic head of the present invention, a thickness of the insulating layers is in the range of 1~10 nm.

The head gimbal assembly of the present invention is configured to have a slider comprising the above mentioned thin film magnetic head and disposed in a manner of being opposed to a recording medium, and a suspension for elastically supporting the slider.

The magnetic disk device of the present invention is configured to have a slider comprising the above mentioned thin film magnetic head and disposed in a manner of being opposed to a recording medium, and a positioning device for supporting the slider and positioning the slider with respect to the recording medium.

A method of manufacturing the thin film magnetic head of the present invention has a multi-layered film body forming step of forming a multi-layered film body comprising an MR multi-layered film formed by sequentially layering a magnetic pinned layer, a nonmagnetic layer and a free layer on a substrate; a mask pattern forming step of forming a resist mask with a predetermined shape by exposing and developing a resist after the resist is formed on the multi-layered film body; an ion milling step of forming junction tapered parts in the width direction of the multi-layered film body by ion milling the multi-layered film body using the resist mask; a magnetic pinned layer end part oxidation treatment step of irradiating oxygen-containing beams to the film surface at a predetermined angle so that magnetic pinned layer oxidized films can be formed on end parts of the magnetic pinned layer, which is provided beneath the nonmagnetic layer, at the junction tapered parts using a residual resist mask after the ion milling step; and a step of forming a pair of bias magnetic field application layers on both end parts of the junction tapered parts via insulating layers in order to apply a vertical bias magnetic field to the free layer.

As a preferred method of producing the thin film magnetic head of the present invention, two types of resists are formed with two layers in the mask pattern forming step, and a first resist that is formed first has a higher etching rate against a developing liquid than a second resist that is formed later.

As a preferred method of producing the thin film magnetic head of the present invention, components composing the multi-layered film body are deposited on a surface of the residual resist mask after the ion milling step.

As a preferred method of producing the thin film magnetic head of the present invention, the oxygen-containing beam in the magnetic pinned layer end part oxidation treatment step contains 5~16 vol. % of oxygen in inert gas.

As a preferred method of producing the thin film magnetic head of the present invention, the oxygen-containing beam is irradiated to a film surface at 65~90 angles while a target to be irradiated rotates in the magnetic pinned layer end part oxidation treatment step.

DETAILED DESCRIPTION OF THE INVENTION

A description of the best mode for implementing the present invention is given below in detail.

Figure 1:
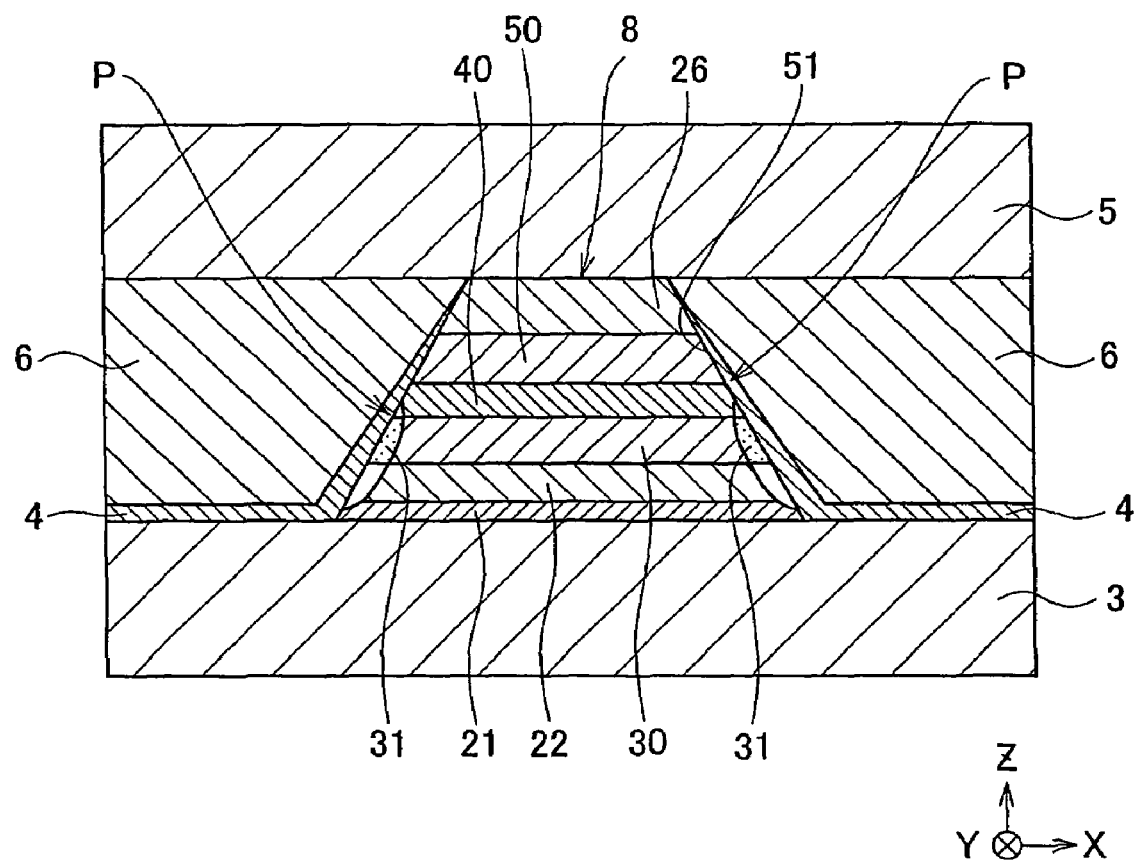
FIG. 1 is a sectional view mainly showing a cross section parallel to the medium-opposed surface of a reproducing head in the embodiment of the present invention.

FIG. 1 illustrates an air bearing surface (ABS) of the reproducing head according to the embodiment of the present invention. The ABS is equivalent to the surface of a reproducing head opposed to a recording medium (also referred to as the medium-opposed surface). The ABS according to the scope of the present invention includes a cross section of a position at which the layered structure of an element can clearly be observed, and therefore a protecting layer such as DLC (i.e., a protecting layer covering an element) positioned at the medium-opposed surface in a strict sense can be excluded as needed, for example.

FIG. 2~FIG. 6 are views, as seen from the ABS, chronologically illustrating a method of manufacturing the thin film magnetic head according to the present invention.

In the following explanation of the present invention, the size in the direction of the X-axis in the views is referred to as "width," the size in the direction of the Y-axis is referred to as "length," and the size in the direction of the Z-axis is referred to as "thickness," respectively. In the direction of the Y-axis, the side close to the ABS and its opposite side (back side) are described as "anterior (or forward)" and "posterior (or backward)," respectively. The direction of piling up a layered layer and its opposite direction are referred to as "upward" or "up side" and "downward" or "down side," respectively.

[Explanation of a Reproducing Head Having an MR Element]

A description of the structure of a reproducing head (thin film magnetic head) having the MR element according to the present invention is given below in detail by referring to FIG. 1.

MR elements include an AMR element using the anisotropic MR effect, a GMR element using the giant magneto-resistive effect and a TMR element using the tunnel-type magneto-resistive effect.

In the present embodiment, a GMR element having a structure that allows a sense current to flow in the perpendicular direction (layering direction) relative to the surface of each layer forming the element, that is, a current perpendicular to plane (CPP) structure (a CPP-GMR element) is used as a preferred example of MR elements.

The reproducing head according to the present embodiment has a first shield layer 3 (also referred to as "a lower shield layer 3") and a second shield layer 5 (also referred to as "an upper shield layer 5") that are disposed in a manner of being opposed to each other up and down in the view at a predetermined distance as shown in FIG. 1 and an MR element 8 (also referred to as "a CPP-GMR element 8") disposed between the first shield layer 3 and the second shield layer 5.

Moreover, as shown in FIG. 1, junction tapered parts P are formed on both end parts of the CPP-GMR element 8 (magneto-resistive effect film) in the width direction (X direction) (i.e., two sides of the CPP-GMR element 8). A pair of bias magnetic field application layers 6 are formed on both end parts of the junction tapered parts P. The bias magnetic field application layers 6 are configured to apply a vertical bias magnetic field to a free layer 50 which is described below via insulating layers 4.

The first shield layer 3 and the second shield layer 5 in the present embodiment serve as so-called magnetic shields as well as a pair of electrodes. In other words, in addition to the function of magnetic shields, they also function as a pair of electrodes to allow a sense current to flow through the CPP-GMR element 8 in the direction of crossing the surface of each layer constituting the CPP-GMR element 8, that is, in the direction perpendicular to (i.e., in the layering direction of) the surface of each layer constituting the CPP-GMR element 8.

Apart from the first shield layer 3 and the second shield layer 5, a pair of electrodes may newly be formed above the upper portion and below the lower portion of the CPP-GMR element 8.

The CPP-GMR element 8 of the reproducing head as shown in FIG. 1 is constituted as a multi-layered film formed by sequentially layering an antiferromagnetic layer 22 as a pinning layer formed on the first shield layer 3 via a foundation layer 21, a magnetic pinned layer 30 formed on the antiferromagnetic layer 22, a nonmagnetic layer 40 formed on the magnetic pinned layer 30, a free layer 50 formed on the nonmagnetic layer 40 and a cap layer 26 (protecting layer 26) formed on the free layer 50.

This multi-layered film is sandwiched between the first shield layer 3 and the second shield layer 5 and allows a sense current to flow in the thickness direction of the multi-layered film by applying a voltage between the first shield layer 3 and the second shield layer 5.

The free layer 50 is a magnetic layer whose magnetization direction changes in accordance with an external magnetic field.

The magnetic pinned layer 30 is a magnetic layer whose magnetization direction is pinned by the antiferromagnetic layer 22 that produces the pinning effect.

A description of each layer constituting the CPP-GMR element 8 is given below in more detail.

(Explanation of Magnetic Pinned Layer 30)

The magnetic pinned layer 30 according to the present invention is formed on the antiferromagnetic layer 22 that is formed via the foundation layer 21 formed on the first shield layer 3 in order to produce the above pinning effect.

The magnetic pinned layer 30 may be either a single layer or a multiple layer configuration.

A description of the multiple layer configuration (or layered configuration), which is the preferable embodiment, is given below. The magnetic pinned layer 30 is formed by sequentially layering an outer layer, a nonmagnetic intermediate layer and an inner layer from the side of the antiferromagnetic layer 22 in a manner of forming a so-called synthetic pinned layer. The outer layer and the inner layer may be configured of ferromagnetic materials containing Co or Fe, for example. The outer layer and the inner layer are antiferromagnetically coupled in a manner that allows their magnetization directions oriented to be opposite to each other.

It is preferred that the outer layer and the inner layer are alloy layers containing $Co_{70}Fe_{30}$ (atom %), for example. It is preferred that the outer layer is about 3~7 nm in thickness and the inner layer about 3~10 nm in thickness. The nonmagnetic intermediate layer is constituted of nonmagnetic materials containing at lease one type selected from a group consisting of Ru, Rh, Ir, Re, Cr, Zr and Cu. The nonmagnetic intermediate layer is about 0.35~1.0 nm in thickness, for example. The nonmagnetic intermediate layer is provided to pin the magnetization of the inner layer and the magnetization of the outer layer in opposite directions.

(Explanation of Free Layer 50 and Cap Layer 26)

The free layer 50 is a layer whose magnetization direction changes in accordance with an external magnetic field (i.e., a signal magnetic field from a recording medium) and is constituted of a ferromagnetic layer having a small retentivity (soft magnetic layer). The free layer 50 is about 2~10 nm in thickness, for example. The free layer 50 may be structured either as a single layer or as a multi-layered film having multiple ferromagnetic layers.

A cap layer 26 (protecting layer 26) of a Ta or Ru layer, for example, is formed on such a free layer 50, as shown in FIG. 1. The layer is about 0.5~20 nm in thickness.

(Explanation of Nonmagnetic Layer 40)

In case of the TMR element, the nonmagnetic layer 40 may be formed of oxides, nitrides or the like of Al, Ni, Gd, Mg, Ta, Mo, Ti, W, Hf or Zr.

In case of the CPP-GMR element, the following material may be used: Cu, Ag, Au, Ru, Rh, Ir, Re, Cr, Zr, Al, Mg, Mn, Nb, Pd, Pt, Ta, Ti and V. It may be a layered body made of Zn/ZnO/Cu or the like. Its thickness is about 0.3~2.0 nm.

(Explanation of Antiferromagnetic Layer 22)

The antiferromagnetic layer 22 that functions as a pinning layer acts in a manner of pinning the magnetization direction of the magnetic pinned layer 30 by the exchange-coupling with the magnetic pinned layer 30 as described above.

The antiferromagnetic layer 22 is configured of at least one type of element M' selected from a group consisting of Pt, Ru, Rh, Pd, Ni, Cu, Ir, Cr and Fe, and is configured of antiferromagnetic materials containing Mn. It is preferred that the content of Mn is 35~95 atom %. Antiferromagnetic materials include (1) non-thermal treatment type antiferromagnetic materials that exhibit antiferromagnetic properties without thermal treatment and induce an exchange-coupling magnetic field with ferromagnetic materials and (2) thermal treatment type antiferromagnetic materials that exhibit antiferromagnetism with thermal treatment. In the present invention, either type (1) or type (2) may be used. Non-thermal treatment type antiferromagnetic materials include RuRhMn, FeMn and IrMn. Thermal treatment type antiferromagnetic materials include PtMn, NiMn and PtRhMn.

The antiferromagnetic layer 22 is about 4~30 nm in thickness.

As a layer for pinning the magnetization direction of the magnetic pinned layer 30, a hard magnetic layer made of hard magnetic material such as CoPt may be disposed instead of the above-mentioned antiferromagnetic layer 22.

The foundation layer 21 formed beneath the antiferromagnetic layer 22 is a layer for enhancing crystallizability and orientation of each layer formed thereabove and is particularly provided for improving exchange-coupling between the antiferromagnetic layer 22 and the magnetic pinned layer 30. For such a foundation layer 21, a layered body of a Ta layer and a NiFe layer or a Ta layer and a NiCr layer is used, for example. The foundation layer 21 is about 2~6 nm in thickness, for example.

Moreover, material constituting the insulating layer 4 as shown in FIG. 1 is made of alumina, for example. The insulating layer 4 is about 1~10 nm in thickness.

As the bias magnetic field application layer 6, a hard magnetic layer (hard magnet) or a layered body made of a ferromagnetic layer and an antiferromagnetic layer can be used, for example. More specifically, CoPt and CoCrPt may be used. Also, Cr or the like may be used as a foundation layer for the bias magnetic field application layer 6. The bias magnetic field application layer 6 functions in a manner of applying the vertical magnetic field to the free layer 50, as described above.

(Explanation of Structure of Main Part of Thin Film Magnetic Head of the Present Invention)

The main part of the thin film magnetic head according to the present invention is a structure of oxidized films having a predetermined thickness at predetermined sites of the junction tapered parts P so that the vertical bias magnetic field applied from the bias magnetic field application layer 6 is intensively and effectively applied to the free layer 50.

In other words, the structure is such that the oxidized films are intentionally formed on the end parts of the magnetic pinned layer 30 at the junction tapered parts P and that the oxidized films are formed as little as possible on the end parts of the free layer 50 at the junction tapered parts P.

Given that the magnetic pinned layer oxidized films 31 (MPL oxidized film 31) provided on the end parts of the magnetic pinned layer 30 at the junction tapered parts P is Hx (unit: nm) in thickness and that the free layer oxidized films 51 (FL oxidized film 51) provided on the end parts of the free layer 50 at the junction tapered parts P is Hf (unit: nm) in thickness, it is preferred that the oxidized film thickness ratio (Hf/Hx) is not more than 0.5 and particularly not more than 0.4. If the oxidized film thickness ratio (Hf/Hx) exceeds 0.5, there occurs an inconvenience that the deviation σ of MR waveform asymmetry becomes too large as shown in the below-mentioned experimental embodiments.

If the thickness of an oxidized film is specified by numerical values, the MPL oxidized films 31 having a thickness Hx of 0.6~2.0 nm are disposed on the end parts of the magnetic pinned layer 30 at the junction tapered parts P. On the other hand, the FL oxidized films 51 having a thickness not more than half of that of the MPL oxidized films 31 are disposed on the end parts of the free layer 50 at the junction tapered parts P. Ideally, it is preferred that there exists substantially no FL oxidized film 51. As used herein, the term "there exists substantially no oxidized film" refers to an oxidized film having a thickness of not more than 0.3 nm.

Although the reference numeral 51 is shown in FIG. 1 as the FL oxidized film 51, the oxidized film is not schematically described in the view as large as visually recognized.

If the thickness Hx of the MPL oxidized film 31 is less than 0.6 nm, it is difficult to effectively apply a bias magnetic field to the free layer 50. As a result, there tends to occur an inconvenience that the deviation σ of the MR waveform asymmetry becomes too large. To put differently, the substantially minimum thickness Hx of the MPL oxidized films 31 is 0.6 nm. The films 31 function to decrease the effective magnetic field to be applied to the magnetic pinned layer 30.

If the thickness Hx of the MPL oxidized film 31 exceeds 2.0 nm, the essential magnetic moment of the magnetic pinned layer 30 that contributes to the MR ratio will lose more than necessary by oxidation. As a result, the MR ratio declines.

It is desirable to not form an oxidized film wherever possible on the end parts of the nonmagnetic layer 40 and the antiferromagnetic layer 22 at the junction tapered parts P. If any oxidized film is formed on the end parts of the nonmagnetic layer 40 and the antiferromagnetic layer 22 at the junction tapered parts P, the thickness is desirably not more than 2.0 nm.

(Explanation of Method for Manufacturing Main Part of Thin Film Magnetic Head of the Present Invention)

A description of a method for manufacturing the thin film magnetic head of the invention having the above-mentioned oxidized film ration (Hf/Hx) is given below by referring to FIG. 2~FIG. 6.

FIG. 2~FIG. 6 are views from the ABS side for chronologically illustrating the method of manufacturing the thin film magnetic head of the invention.

The method for manufacturing the thin film magnetic head according to the present invention has (1) a multi-layered film body forming step of forming multi-layered film including an MR multi-layered film formed by sequentially layering a magnetic pinned layer, a nonmagnetic layer and a free layer on a substrate, (2) a mask pattern forming step of forming a resist mask having a predetermined pattern by exposing and developing a resist after the resist is formed on the multi-layered film body, (3) an ion milling step of forming junction tapered parts in the width direction of the multi-layered film body by ion-milling the multi-layered film body using the resist mask, (4) a magnetic pinned layer end part oxidation treatment step of irradiating oxygen-containing beams to the film surface at a predetermined angle so that oxidized films of the magnetic pinned layer (MPL oxidized films) is formed on the end parts of the magnetic pinned layer at the junction tapered parts, which is provided beneath the nonmagnetic layer, using a residual resist mask after the ion milling step and (5) a step of forming a pair of bias magnetic field application layers on both end parts of the junction tapered parts via insulating layers in order to apply the vertical bias magnetic field to the free layer.

A description of each step is given below by sequentially referring to views.

(1) Multi-Layered Film Body Forming Step

Figure 2:
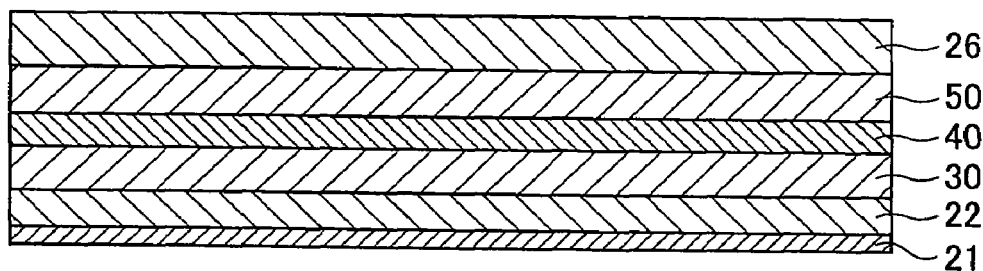
FIG. 2 is a view, as seen from the ABS side, illustrating a method of manufacturing the magneto-resistive effect element according to the present invention.
Figure 2:
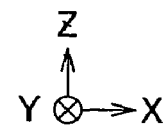

As shown in FIG. 2, a multi-layered film body including an MR multi-layered film formed by sequentially accumulating a magnetic pinned layer 30, a nonmagnetic layer 40 and a free layer 50 is formed on a substrate.

More specifically, a first shield layer 3 (not shown here) is used as a substrate, and a foundation layer 21, an antiferromagnetic layer 22, a magnetic pinned layer 30, a nonmagnetic layer 40, a free layer 50 and a cap layer 26 (protecting layer 26) are sequentially formed, so-called as flat films (films having a flat surface), on the first substrate. The sputtering method is usually used for forming films.

(2) Mask Pattern Forming Step

Figure 3:
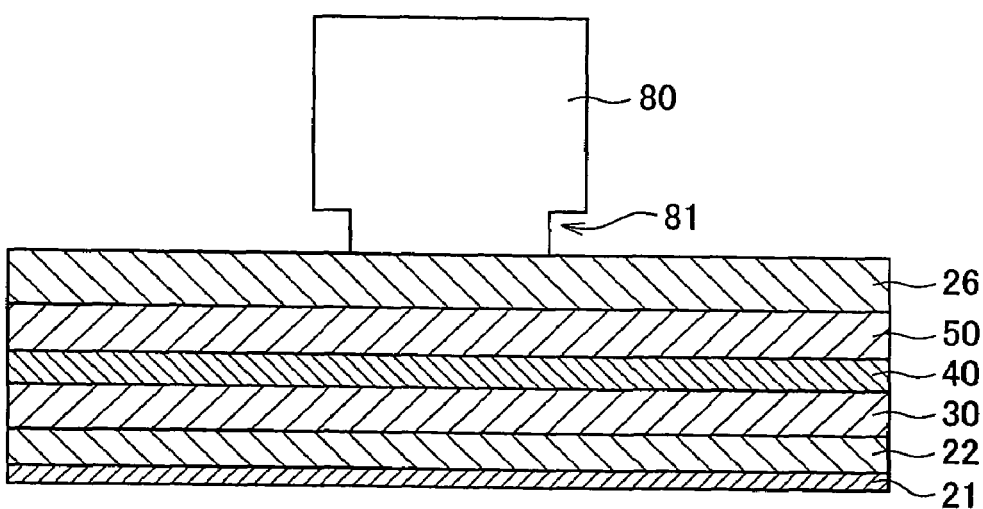
FIG. 3 is a view, as seen from the ABS side, illustrating a method of manufacturing the magneto-resistive effect element according to the present invention.
Figure 3:
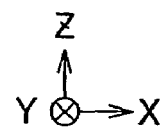

As shown in FIG. 3, a resist mask 80 having a predetermined shape is formed by means of exposure and development of a resist after the resist is formed. Two types of resists are usually used in the mask pattern forming step. The resist mask 80 as shown in FIG. 3 is formed because a first resist, which is formed first, has a higher etching rate against a developing liquid than a second resist, which is formed later. In other words, the resist mask 80 is formed in a manner that the lower layer has a jaw 81 deeply dug sideways. The stepped section forming the jaw 81 is the portion at which the type of resist is separated. As described above, the lower layer resist is higher in the developing rate against a developing liquid than the upper layer resist.

(3) Ion Milling Step

Figure 4:
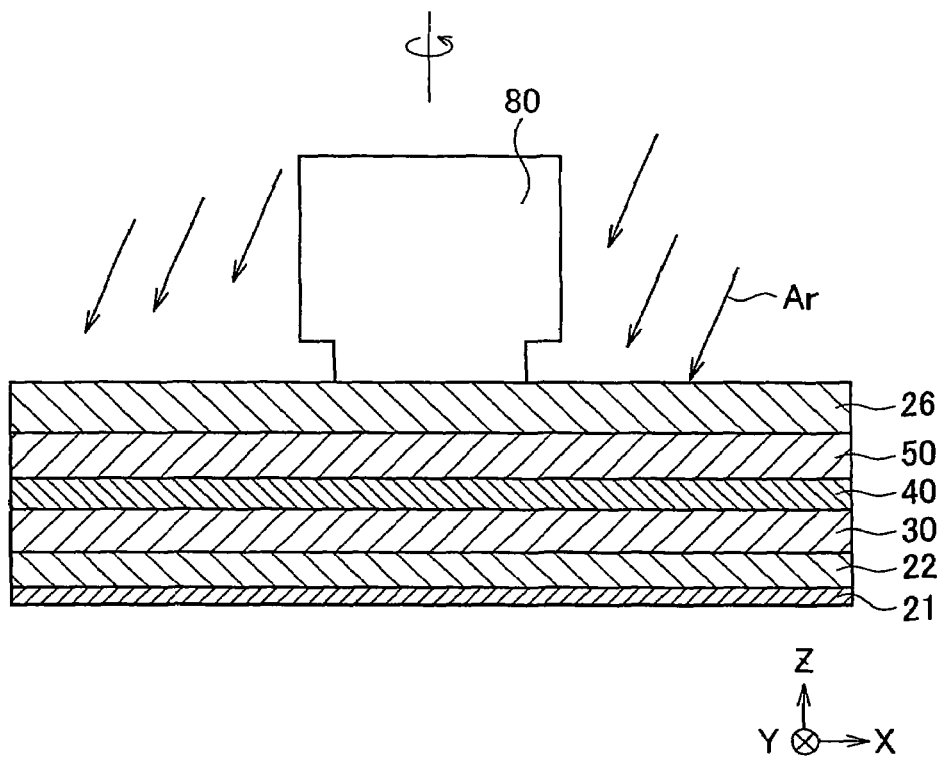
FIG. 4 is a view, as seen from the ABS side, illustrating a method of manufacturing the MR effect element according to the present invention.
Figure 5:
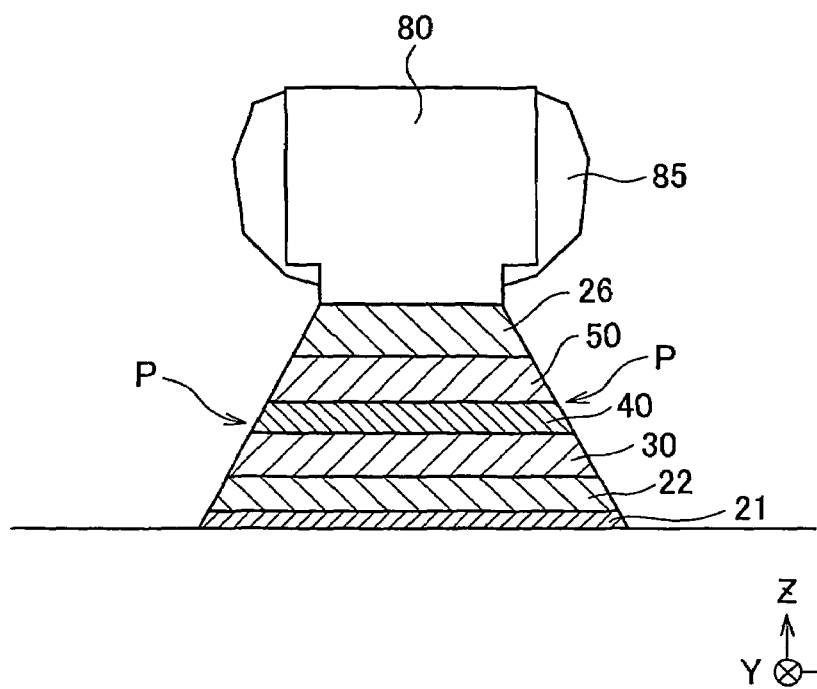
FIG. 5 is a view, as seen from the ABS side, illustrating a method of manufacturing the MR effect element according to the present invention.

As shown in FIG. 4, a multi-layered film body is milled using the resist mask 80 to form junction tapered parts P in the width direction of the multi-layered film body. In general, Ar ion milling is conducted using Ar while rotating the substrate. The milling angle is usually in the range of 45~90 degrees relative to the substrate surface. The angle perpendicular to the substrate is 90 degrees. As a result, the junction tapered parts P are formed in the width direction (x-direction) of the multi-layered film body as shown in FIG. 5. Also components 85 constituting the multi-layered film body (see FIG. 2) are accumulated on the outer surface of the remaining resist mask 80 after the ion milling step, thereby enlarging the volume of the resist mask 80 outwardly.

It is assumed that the resist mask 80 thickened as a result of the deposition of the components 85 contribute to the oxidation treatment of predetermined portions of the present invention.

(4) Magnetic Pinned Layer End Part Oxidation Treatment Step

Figure 6:
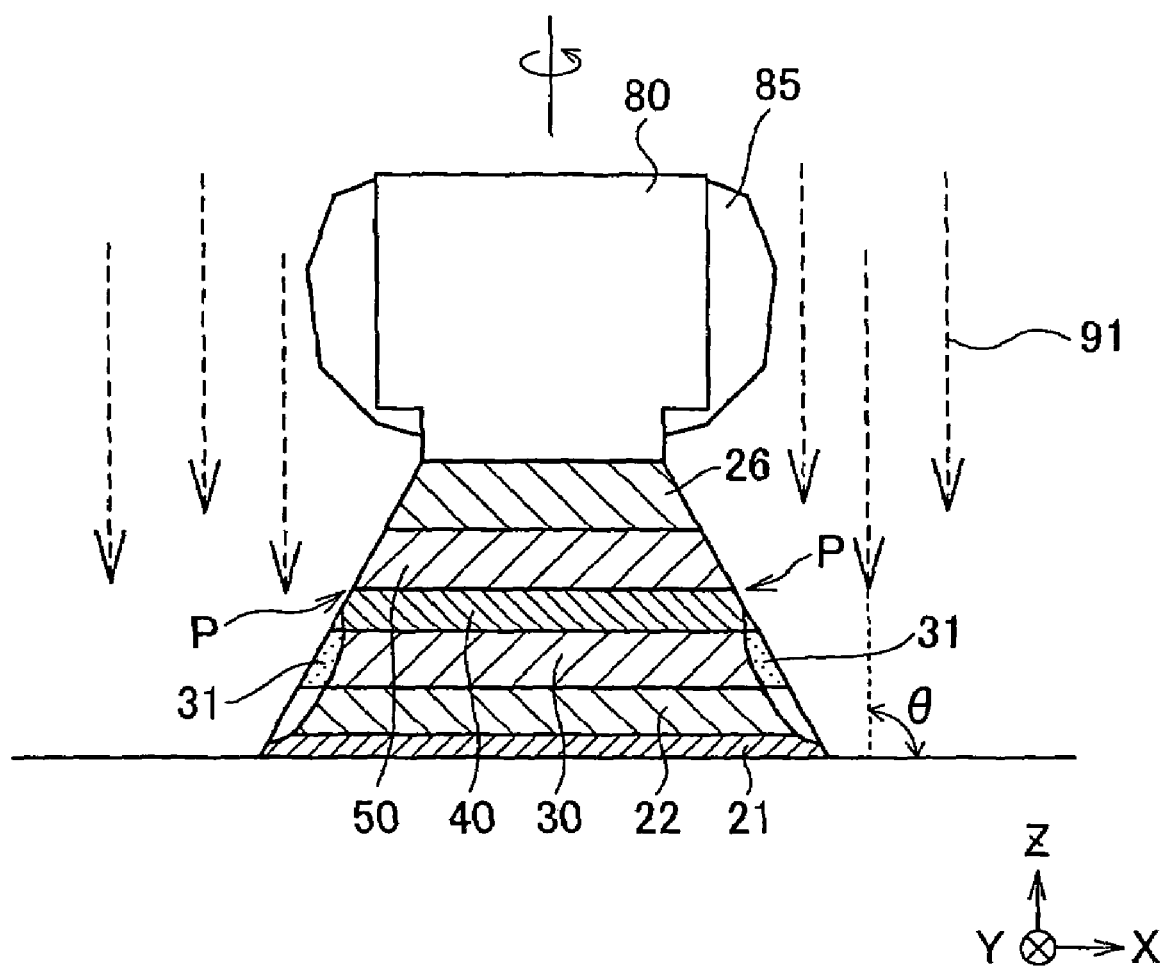
FIG. 6 is a view, as seen from the ABS side, illustrating a method of manufacturing the MR effect element according to the present invention.

As shown in FIG. 6, oxygen-containing beams 91 are irradiated to a film surface at a predetermined angle θ (degrees) for a predetermined time T (seconds) while a target to be irradiated (or elements of the multi-layered body) rotates so that the MPL oxidized films 31 are formed on the end parts of the magnetic pinned layer 30, which is positioned lower than the nonmagnetic layer 40, at the junction tapered parts P using the remaining resist mask 80 containing the reattached components 85 after the ion milling step.

The irradiation angle θ (degrees) is such that only the end parts of the magnetic pinned layer 30 can be oxidized partially and efficiently at the junction tapered parts P and that the end parts of the free layer 50 are not oxidized as less as possible by avoiding the influence of the irradiation. This angle θ can experimentally be calculated as shown in the embodiments below.

The element shape is basically controlled by the difference of width between the first layer resist (the first lower layer resist) and the second layer resist (the second upper layer resist) and an Ar ion milling angle.

It has been confirmed by the embodiments below that the angle θ (degrees) is in the range of 65~90 degrees and preferably in the range of 75~90 degrees.

The longer the oxidation time T is, the thicker the oxidized film becomes. The preferable oxidation time T can experimentally be determined.

In any case, the irradiation angle θ (degrees) and irradiation time T (seconds) are set such that the MPL oxidized film 31 having a thickness of 0.6~2.0 nm is provided on the end parts of the magnetic pinned layer 30 at the junction tapered parts P, and that the FL oxidized layer 51 having a thickness not more than half of that of the MPL oxidized films 31 is provided on the end parts of the free layer 50 at the junction tapered parts P.

Oxygen-containing beams are oxygen plasma beams containing 5~16 vol. % of oxygen in inert gas. More specifically, gas components of oxygen-containing beams 91 may be Ar and 5~16 vol. % of oxygen (preferably 8~13 vol. % of oxygen). The addition of oxygen sharply decreases the etching effectiveness. It has been confirmed that the etched amount thereby barely influences the characteristics.

The irradiation of such oxygen-containing beams may be carried out by using an ion milling device, for example.

(5) Step of Forming a Pair of Bias Magnetic Field Application Layers

After the completion of the above-mentioned oxidation treatment step on the end parts of the magnetic pinned layer, insulating layers 4 are formed on both junction tapered end parts. Then, a pair of bias magnetic field application layers 6 are formed in order to apply a vertical bias magnetic field to the free layer 50. Subsequently, the second shield layer 5 is formed, resulting in the state as shown in FIG. 1.

(Explanation of Overall Constitution of Thin Film Magnetic Head)

A description of the overall constitution of the schematic view of the abovementioned thin film magnetic head is illustrated below.

Figure 7:
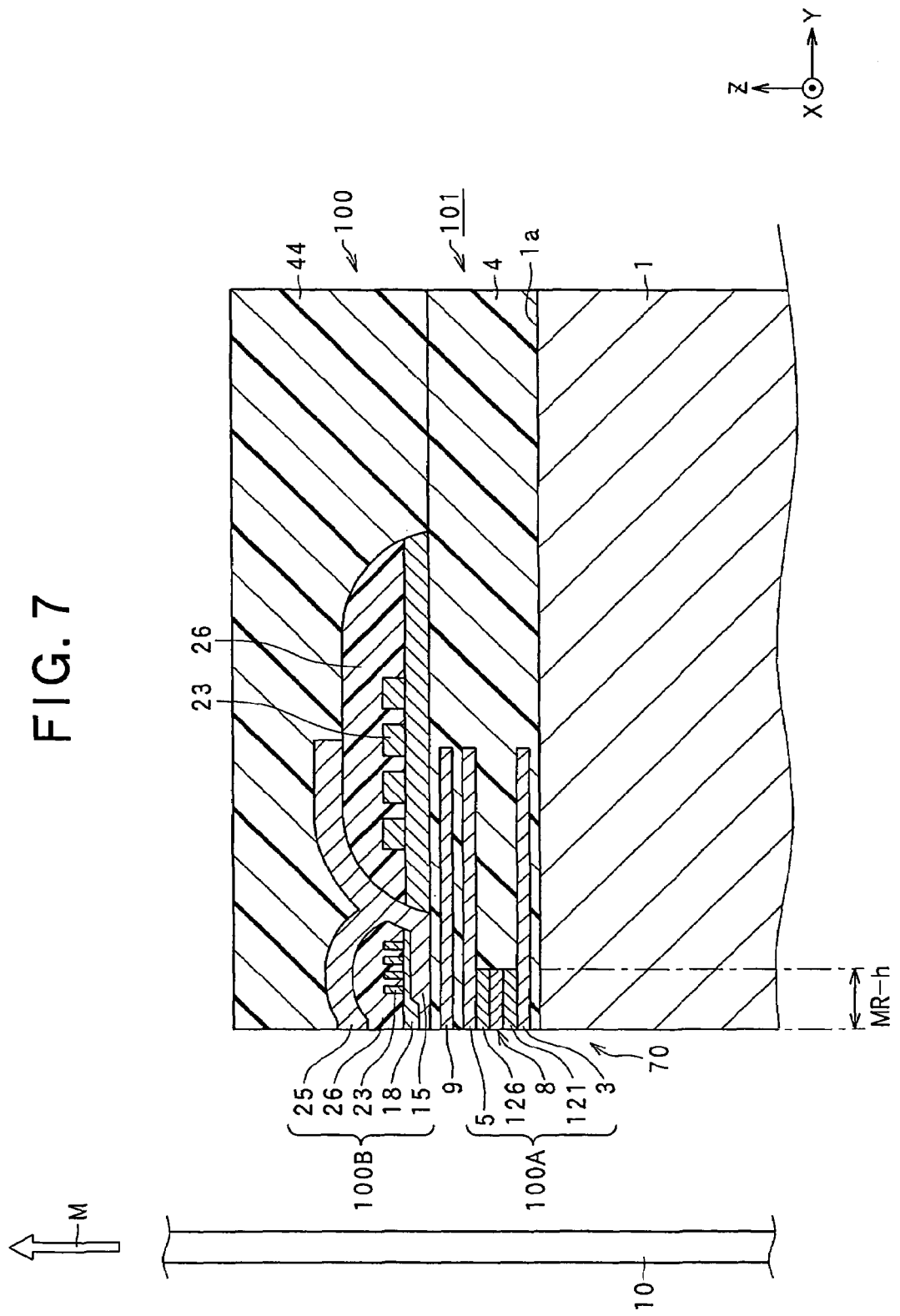
FIG. 7 is a sectional view illustrating the constitution of the thin film magnetic head according to one preferred embodiment of the present invention and showing a cross section perpendicular to the medium-opposed surface of the thin film magnetic head and the substrate.

FIG. 7 shows a sectional view (i.e., a cross section taken by a Y-Z plane) of a thin film magnetic head that is disposed parallel to the so-called ABS.

A thin film magnetic head 100 as shown in FIG. 7 is mounted on a magnetic recording device such as a hard disk drive in order to magnetically treat a recording medium 10 such as a hard disk that moves in the traveling direction M of the medium.

The thin film magnetic head 100 as shown in FIG. 7 is a so-called complex type head that is feasible to execute both recording treatment and reproducing treatment as magnetic treatment. As shown in FIG. 7, the structure includes a magnetic head part 101 formed on a slider substrate configured of ceramic materials such as AlTic ($Al_2O_3$.TiC).

The constitution of the magnetic head part 101 is such that a reproducing head 100A for reproducing magnetic information recorded using the MR effect and a shield-type recording head part 100B for executing recording treatment in the perpendicular recording system, for example, are layered on each other.

A description is given below in more detail.

A first shield layer 3 and a second shield layer 5 are flat layers formed in a manner of being substantially parallel to the side surface 1a of the slider substrate 1. These layers 3 and 5 form part of the ABS that is the medium-opposed surface 70.

The MR element 8 is disposed in a manner of being sandwiched between the first shield layer 3 and the second shield layer 5, forming a part of the medium-opposed surface 70. The height in the perpendicular direction (Y direction) of the medium-opposed surface 70 is the MR height (MR-h).

The first shield layer 3 and the second shield layer 5 may be formed by a pattern plating method including a frame plating method, for example.

The MR element 8 is a layered film formed in a manner of being substantially parallel to the side surface 1a of the slider substrate 1, constituting part of the medium-opposed surface 70.

The MR element 8 is a CPP type layered film that allows a sense current to flow in the direction perpendicular to its layering surface.

As shown in FIG. 7, an interelement shield layer 9 made of the same material as that of the second shield layer 5 is formed between the second shield layer 5 and the recording head part 100B.

The interelement layer 9 functions in a manner of shielding the MR element 8 that functions as a sensor from a magnetic field generated by the recording head part 100B, thereby blocking exogenous noises at the time of reading. A bucking coil part may also be formed between the interelement layer 9 and the recording head part 100B. The bucking coil part generates magnetic flux that overrides a magnetic flux loop that is generated by the recording head part 100B and passes through the upper and lower electrode layers of the MR element 8 and, therefore, functions in order to suppress unnecessary writing to a magnetic disk or wide area adjacent tracks erasing (WATE) phenomena that are types of erasing operations.

Insulating layers 4 and 44 made of alumina or the like are formed in a gap between the first and second shield layers 3 and 5 on the side opposite the medium-opposed surface 70 of the MR element 8; in the posterior region between the first and second shield layers 3 and 5 and the interelement shield layer 9 on the side opposite the medium-opposed surface 70;

in a gap between the first shield layer 3 and the slider substrate 1; and in a gap between the interelement shield layer 9 and the recording head part 100B.

The recording head part 100B is preferably configured for perpendicular magnetic recording, as shown in FIG. 7. The part 100B includes a main magnetic pole layer 15, a gap layer 18, a coil insulating layer 26, a coil layer 23 and an auxiliary magnetic pole layer 25. Needless to say, a perpendicular recording mechanism may be replaced with a longitudinal recording mechanism.

The main magnetic pole layer 15 is constituted to be a leading magnetic path for leading and focusing magnetic flux initiated by the coil layer 23 to the recording layer of a magnetic recording medium 10 to be written. It is preferred that the end parts of the main magnetic pole layer 15 on the side of the medium-opposed surface 70 be smaller in thickness compared with other portions in the track width direction (i.e., the direction along the X-axis in FIG. 7) and in the layering direction (i.e., the direction along the Z-axis in FIG. 7). As a result, it is possible to generate a magnetic field for minute and strong writing corresponding to high recording density.

A trailing shield part that has a wider layer cross section than the other portions of the auxiliary magnetic layer 25 is formed on the end parts of the auxiliary magnetic pole layer 25 magnetically coupled with the main magnetic pole layer 15 on the side of the medium-opposed surface 70. As shown in FIG. 7, the auxiliary magnetic pole layer 25 is disposed in a manner of being opposed to the end part of the main magnetic pole layer 15 on the side of the medium-opposed surface 70 via the gap layer 18 made of insulating material such as alumina and the coil insulating layer 26.

The auxiliary magnetic pole layer 25 makes the magnetic field gradient steep. The magnetic field gradient is referred to a value observed between the auxiliary magnetic pole layer 25 and the main magnetic pole layer 15 in the vicinity of the medium-opposed surface 70. As a result, signal output jitter is reduced, thereby making the error rate smaller at the time of reading.

The auxiliary magnetic pole layer 25 is formed to about 0.5~5 µm in thickness by a frame plating method, a sputtering method or the like, for example. Employed material may be an alloy made of two or three elements selected from the group consisting of Ni, Fe and Co, for example, or an alloy made of these elements, as main components, plus predetermined chemical elements.

The gap layer 18 is formed in order to separate the coil layer 23 from the main magnetic pole layer 15. The gap layer 18 may be formed by a sputtering method, a CVD method or the like, for example, and may have a thickness of about 0.01~0.5 µm and be constituted of $Al_2O_3$, diamond-like carbon (DLC) or the like.

(Explanation of Head Gimbal Assembly and Hard Disk Device)

Next, a head gimbal assembly on which the abovementioned thin film head is mounted and one embodiment of a hard disk device is described below.

Figure 8:
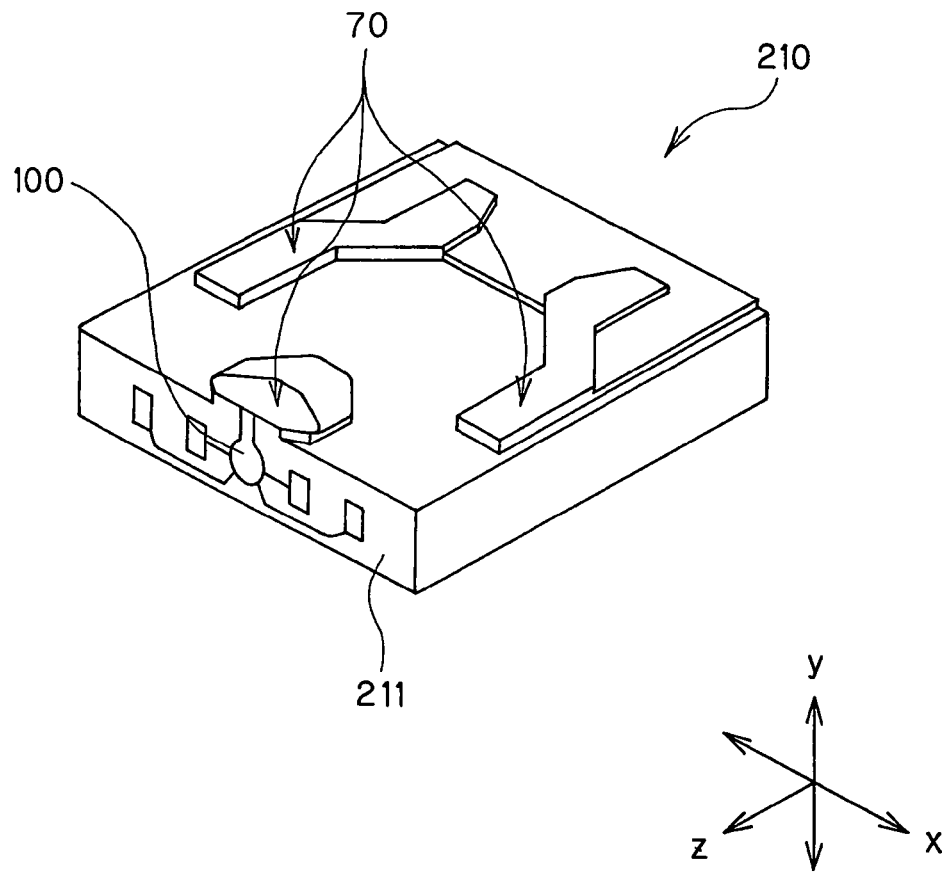
FIG. 8 is a perspective view showing a slider contained in the head gimbal assembly according to one embodiment of the present invention.

First, a description of a slider 210 equipped with the head gimbal assembly is illustrated in FIG. 8. In the hard disk device, the slider 210 is disposed in a manner of being opposed to the hard disk that is a rotatably driven disk-like recording medium. The slider 210 is provided with a base substrate 211 mainly constituted of a substrate and an overcoat.

The base substrate 211 is substantially hexahedronal. Of the six surfaces of the base substrate 211, one surface is disposed in a manner of facing a hard disk. The medium-opposed surface 70 is formed on the surface.

When the hard disk is rotated in the z-direction in FIG. 8, an airflow passing between the hard disk and the slider 210 creates lifting power downwardly in the y-direction in FIG. 8. The slider 210 floats from the surface of the hard disk by the lifting power. The x-direction in FIG. 8 is the track direction of the hard disk.

In the vicinity of the end part of the slider 210 on the airflow outlet side (i.e., the end part on the lower left in FIG. 8), the thin film magnetic head according to the present embodiment is formed.

Figure 9:
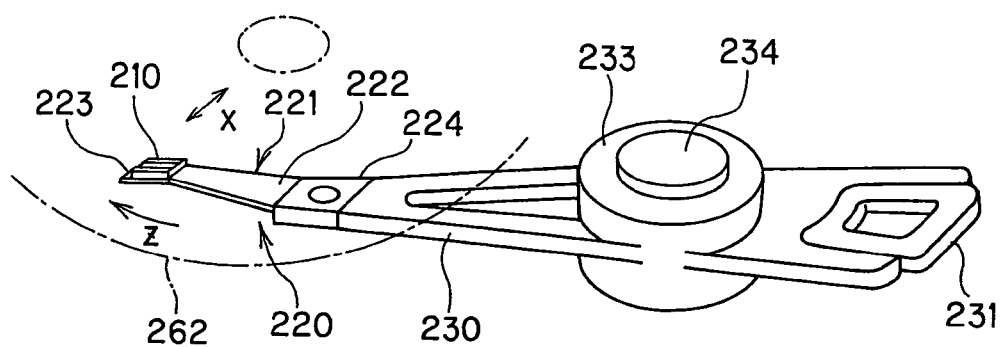
FIG. 9 is a perspective view showing a head arm assembly containing the head gimbal assembly according to one embodiment of the present invention.

Next, a description of the head gimbal assembly 220 according to the present embodiment is described by referring to FIG. 9. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction x of a hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is called a head stack assembly.

FIG. 9 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

A description of one example of head stack assembly and the hard disk device according to the present embodiment is illustrated below by referring to FIG. 10 and FIG. 11.

Figure 10:
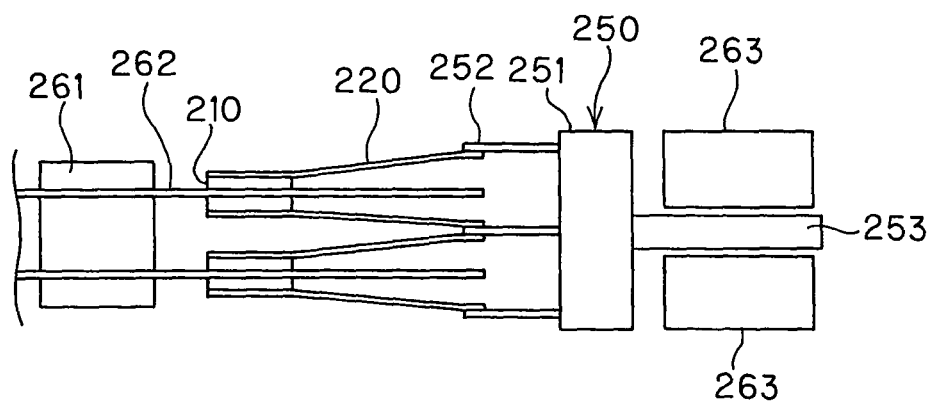
FIG. 10 is an explanatory view showing the main part of the magnetic disk device according to one embodiment of the present invention.
Figure 11:
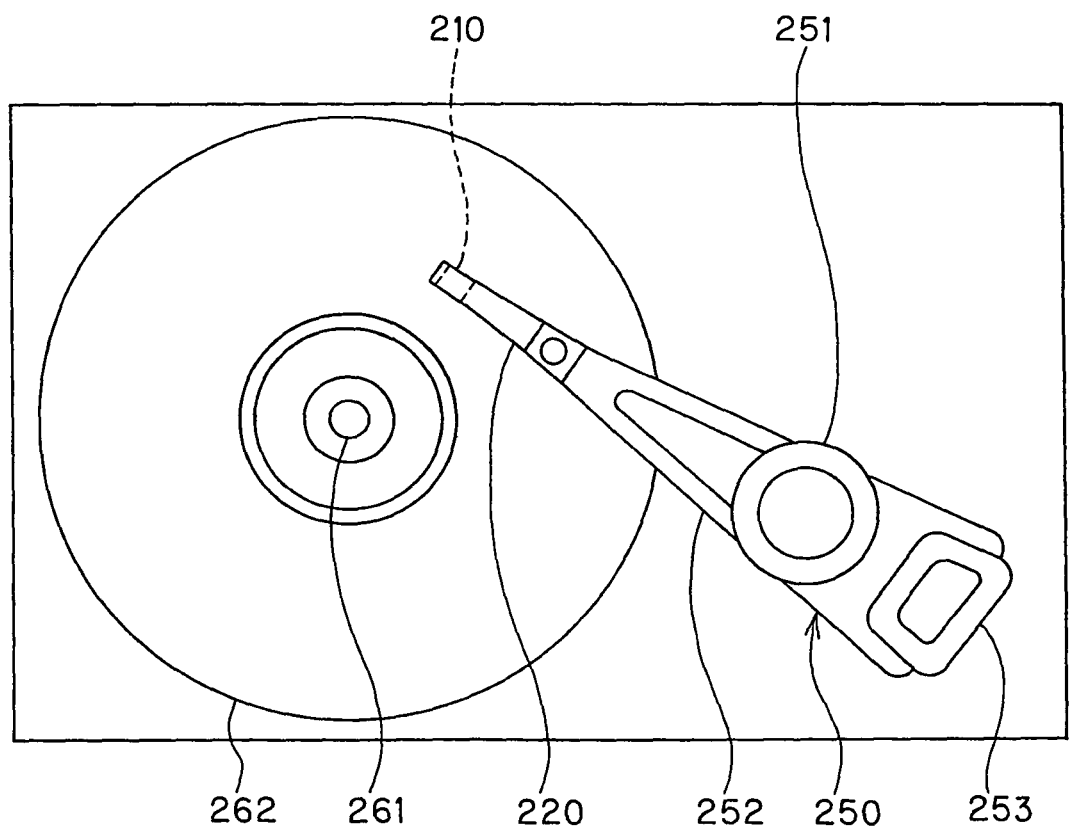
FIG. 11 is a plan view showing the main part of the magnetic disk device according to one embodiment of the present invention.

FIG. 10 is an explanatory view showing the main part of the hard disk device. FIG. 11 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the sliders 210 relative to the hard disk 262 corresponding to a positioning device of the present invention.

In the hard disk device according to the present embodiment, an actuator moves the sliders 210 in the track traversing direction of the hard disk 262 in order to locate the sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

In the embodiment, it is explained that a thin film magnetic head has a structure of a reproducing head part formed on the base substrate side and a perpendicular recording head part layered thereon. However, the layering order may be reversed. Moreover, the structure may be such that only a reproducing part may be provided in the case of a reproduction-only thin film head.

EMBODIMENTS

A description of the abovementioned present invention is described in more detail by referring to exemplary embodiments as shown below.

Experimental Embodiment 1

On a 6-inch substrate, a thin film magnetic head having an MR element for reading is manufactured by the following procedure. The main portion of the thin film magnetic head is manufactured by the following procedure.

(1) A multi-Layered Film Body Forming Step

A first shield layer 3 is formed on the substrate. Sequentially a foundation layer 21, an antiferromagnetic layer 22, a magnetic pinned layer 30, a nonmagnetic layer 40, a free layer 50 and a cap layer 26 (a protecting layer 26) as flat films were formed according to the multi-layered film specification as shown in the following Table 1 (See FIG. 2). A sputtering method was used as a film forming method.

TABLE 1

| Layered structure | | Layer forming materials | Thickness (nm) |
|---|---|---|---|
| Cap layer (26) | | Ta | 4.0 |
| Free layer (50) | | CoFe | 4.0 |
| Nonmagnetic layer (40) | | Al$_2$O$_3$ | 0.7 |
| Magnetic pinned layer (30) | Inner layer | CoFe | 2.5 |
| | Nonmagnetic intermediate layer | Ru | 0.8 |
| | Outer layer | CoFe | 2.0 |
| Antiferromagnetic layer (22) | | IrMn | 7.0 |
| Foundation layer (21) | | Ru | 2.0 |
| | | Ta | 1.5 |

(2) Mask Pattern Forming Step

After two-layer resists were formed on the cap layer 26, the resists were exposed and developed in order to form a resist mask 80, wherein the lower layer has a jaw 81 deeply dug in the side direction as shown in FIG. 3.

(3) Ion Milling Step

An Ar ion milling treatment was conducted on the multi-layered film body using the resist mask 80 as shown in FIG. 4 to form junction tapered parts P in the width direction of the multi-layered film body as shown in FIG. 5.

(4) Magnetic Pinned Layer End Part Oxidation Treatment Step

As shown in FIG. 6, oxygen-containing beams 91 were irradiated using the remaining resist mask 80 containing reattached components 85 after the ion milling step in order to form MPL oxidized films 31 of the magnetic pinned layer 30, which was positioned lower than the nonmagnetic layer 40 on the end parts of the magnetic pinned layer 30 at the junction tapered parts P.

Oxygen-containing beams 91 were irradiated to the film surface at a predetermined angle θ (degrees) for a predetermined time T (seconds) while the irradiated target rotated.

More specifically, oxygen-containing beams 91 were irradiated to a group of thirteen samples as shown in Table 2 according to the procedures as shown in Table 2.

As the oxygen-containing beams 91, a mixed gas (oxygen content ratio: 4.76 vol. %) formed by mixing 20 (twenty) SCCM of Ar gas with 1 (one) SCCM of oxygen was used. The etched amount by irradiating the oxygen-containing beams is a maximum of 0.5 nm or less in the film surface direction. It was confirmed that this level of etched amount does not influence the characteristics of the element.

TABLE 2

(Conditions of magnetic pinned layer end part oxidation treatment step)

| | Oxidation treatment conditions | |
|---|---|---|
| Sample No. | Irradiation angle θ (degrees) | Irradiation time T (sec) |
| 1 | 90 | 15 |
| 2 | 90 | 30 |
| 3 | 90 | 45 |
| 4 | 75 | 15 |
| 5 | 75 | 30 |
| 6 | 75 | 45 |
| 7 | 60 | 15 |
| 8 | 60 | 30 |
| 9 | 60 | 45 |
| 10 | 45 | 15 |
| 11 | 45 | 30 |
| 12 | 45 | 45 |
| 13 | No oxidation treatment | No oxidation treatment |

(5) Bias Magnetic Field Application Layer Forming Step

After the abovementioned magnetic pinned layer end part oxidation treatment step was completed, the insulating layers 4 made of Al$_2$O$_3$ having a thickness of 5.5 nm on both end parts at the junction tapered parts P were formed. Then, a pair of bias magnetic field application layers 6 (a layered body of Cr having a thickness of 5 nm and CoPt having a thickness of 20 nm) were formed in order to apply a vertical bias magnetic field to the free layer 50. Subsequently, a second shield layer 5 was formed to manufacture an element sample as shown in FIG. 1.

The element samples formed by the aforementioned procedures were evaluated by the following procedures with regard to (1) the MR ratio of a total of 2000 elements on the six-inch substrate surface and (2) the asymmetrical variation of MR waveforms among elements.

MR Ratio (%)

The MR ratio was measured by a usual direct current four terminals method. The external magnetic field used for the measurement was ±500Oe. The MR ratio is a value which is obtained by dividing a changed amount resistance ΔR with a resistance value R, and is expressed as ΔR/R. All values were converted into %.

The MR ratio was calculated as an average value of 2000 sample elements.

(2) Variation (Deviation) σ of Asymmetry of MR Waveforms

The external magnetic field used for measuring the MR ratio was ±500Oe. The asymmetry of individual MR waveforms of each element was calculated by the following calculation formula.

Asymmetry (%)=[(|MR+|−|MR−|)/MR(500)]×100 wherein

MR (X): MR ratio in the magnetic field XOe

|MR+|: Absolute value of (MR (+5000e)−MR (0))

|MR−|: Absolute value of (MR (−5000e)−MR (0))

The variation (deviation) σ of the asymmetry of MR waveforms is a standard deviation value of individual asymmetry (%) of 2000 elements calculated by the abovementioned formula.

It is desirable that the deviation σ of the asymmetry of MR waveforms among elements on a six-inch substrate surface is not more than 10% of an average value. If it exceeds 10%, the ability of the bias magnetic field application layers 6 to control the magnetic domain of the free layer 5 is regarded as low, which causes a rise in the rate of occurrence of Barkhausen noises.

Furthermore, high resolution TEM observations were conducted for representative sample elements completed to each of the evaluations of MR waveforms. Further the magnetic pinned layer 30, the thickness Hf of the FL oxidized film 51 and the thickness Hx of the MPL oxidized film 31 on the end parts of the free layer 50 and at the junction tapered parts P were respectively measured.

The relative oxidized film thickness ratios (Hf/Hx) were also calculated.

Table 3 below shows the results.

the irradiation angle θ of oxygen-containing beams 91 was as small as 60 degrees~45 degrees under the oxidation treatment conditions; therefore the end parts of the free layer that should not be oxidized were excessively oxidized, resulting in increasing the oxidized film thickness Hf.

Figure 12:
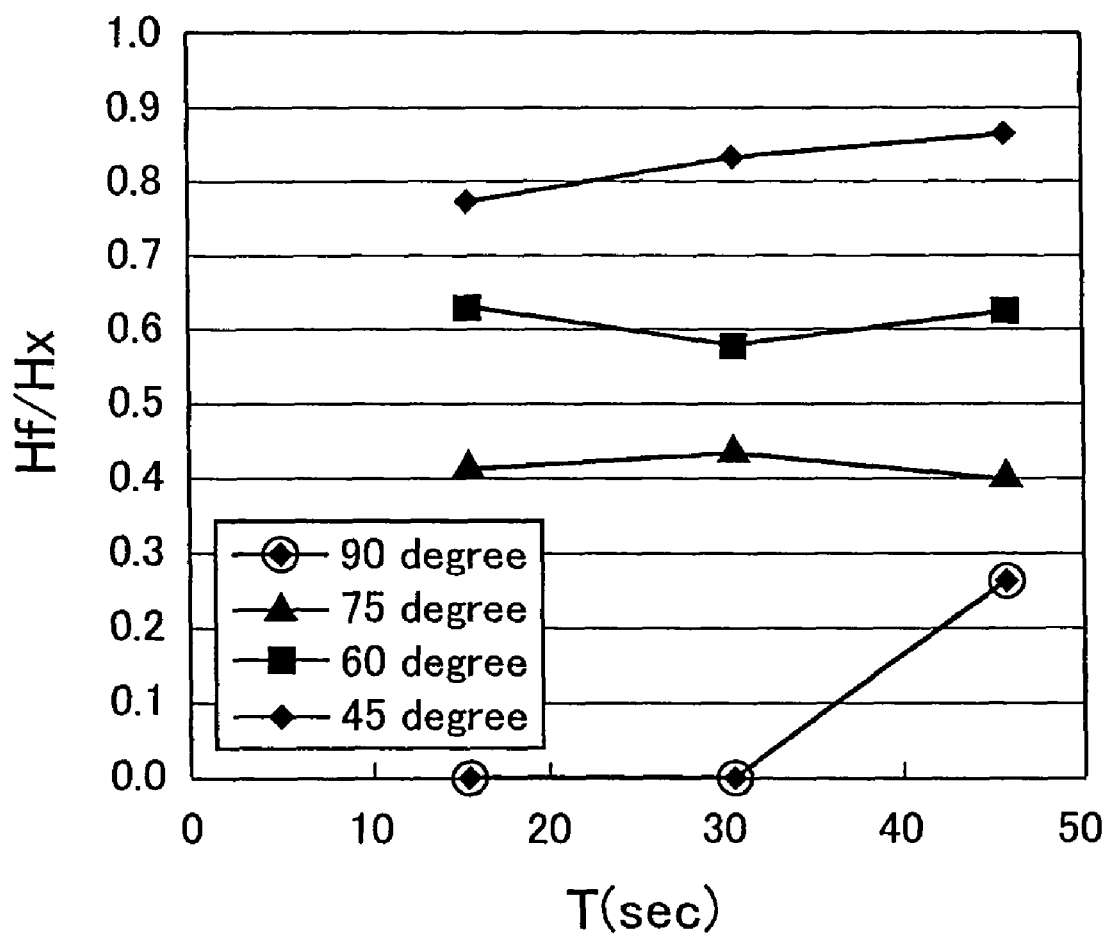
FIG. 12 is a graph showing a relationship between the oxidation treatment time T (sec) and the oxidized film thickness ratio (Hf/Hx) using the irradiation angle θ of oxygen-containing beams as a parameter.
Figure 13:
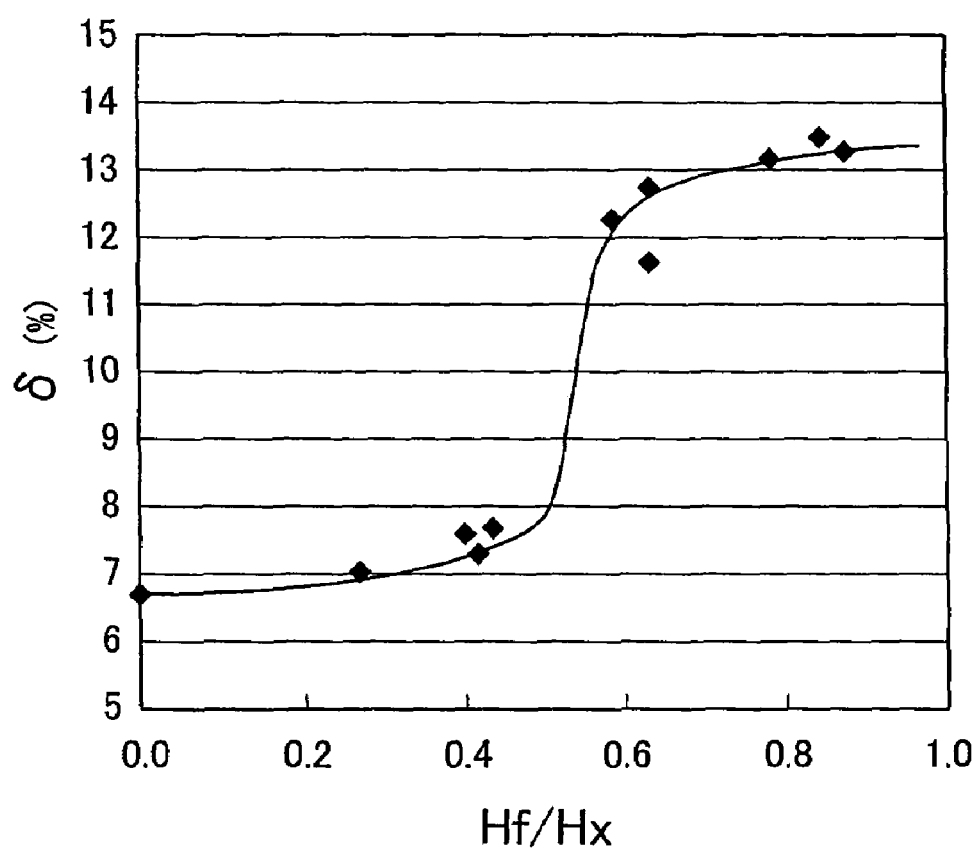
FIG. 13 is a graph showing a relationship between the oxidized film thickness ratio (Hf/Hx) and the deviation σ (%) of MR waveform asymmetry.
Figure 14:
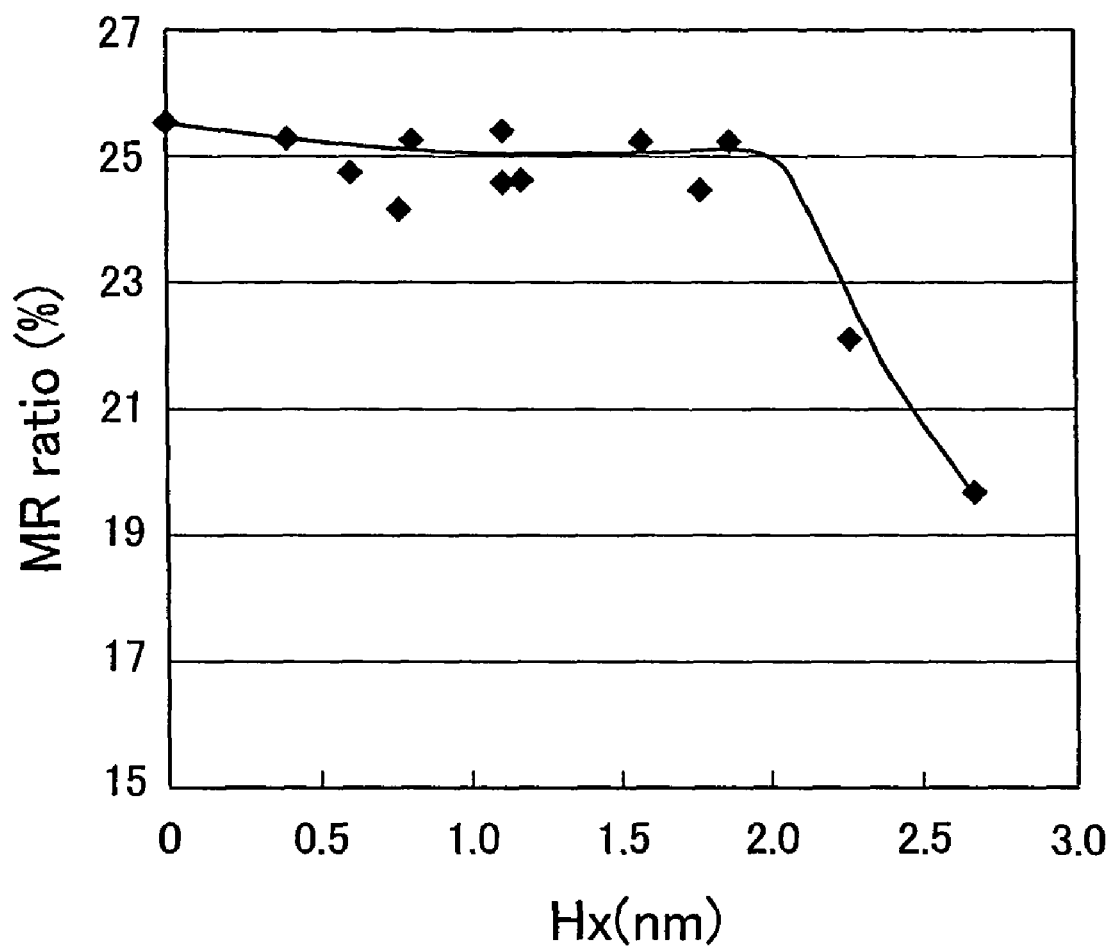
FIG. 14 is a graph showing the relationship between the oxidized film thickness Hx (nm) on the magnetic pinned layer end part and the MR ratio (%).

Based on the experimental data as shown in Table 3 above, FIG. 12 is a graph showing the relationship between the oxidation treatment time T (sec) on the X-axis and the oxidized film thickness ratio (Hf/Hx) on the Y-axis, wherein the parameter is the irradiation angle θ for oxidation treatment. FIG. 13 is a graph showing the relationship between the oxidized film thickness ratio (Hf/Hx) on the X-axis and the deviation σ (%) of the asymmetry of MR waveforms on the Y-axis. FIG. 14 is a graph showing the relationship between the oxidized film thickness Hx (nm) on the end parts of the magnetic pinned layer on the X-axis and the MR ratio (%) on the Y-axis.

The graph in FIG. 12 shows that the oxidized film thickness ratio (Hf/Hx) approaches 1 as the irradiation angle θ of oxygen-containing beams 91 shifts from 90 degrees towards 45 degrees in the oxidation treatment step. In other words, as it shifts from 90 degrees to 45 degrees, the oxygen-containing beams 91 are more greatly irradiated to the free layer 50, which causes an increase in the oxidized film thickness Hf.

The graph in FIG. 13 shows that, if the oxidized film thickness ratio (Hf/Hx) exceeds 0.5, the deviation σ of the

TABLE 3

| Sample No. | Oxidation treatment conditions | | Oxidized film thickness | | | MR ratio (%) | Deviation σ of the asymmetry of MR waveforms (%) |
| | Irradiation angle θ (degrees) | Irradiation time T (sec) | End parts on the free layer Hf (nm) | End parts on the magnetic pinned layer Hx (nm) | Thickness ratio Hf/Hx | | |
| --- | --- | --- | --- | --- | --- | --- | --- |
| 1 | 90 | 15 | 0.0 | 0.4 | 0.00 | 25.3 | 11.0 |
| 2 | 90 | 30 | 0.0 | 0.8 | 0.00 | 24.1 | 6.7 |
| 3 | 90 | 45 | 0.3 | 1.1 | 0.27 | 24.5 | 7.0 |
| 4 | 75 | 15 | 0.3 | 0.6 | 0.42 | 24.7 | 7.3 |
| 5 | 75 | 30 | 0.5 | 1.2 | 0.43 | 24.6 | 7.7 |
| 6 | 75 | 45 | 0.7 | 1.8 | 0.40 | 24.4 | 7.6 |
| 7 | 60 | 15 | 0.5 | 0.8 | 0.63 | 25.3 | 11.7 |
| 8 | 60 | 30 | 0.9 | 1.6 | 0.58 | 25.2 | 12.3 |
| 9 | 60 | 45 | 1.4 | 2.3 | 0.62 | 22.1 | 12.8 |
| 10 | 45 | 15 | 0.9 | 1.1 | 0.77 | 25.5 | 13.2 |
| 11 | 45 | 30 | 1.6 | 1.9 | 0.84 | 25.2 | 13.5 |
| 12 | 45 | 45 | 2.3 | 2.7 | 0.87 | 19.7 | 13.3 |
| 13 | No oxidation treatment | No oxidation treatment | 0.0 | 0.0 | 0.00 | 25.5 | 11.5 |

The results in Table 3 show that the value of deviation σ of the asymmetry of waveforms in Sample No. 1 is substantially the same as that in Sample No. 13 that is not oxidation-treated even though an oxidized film having a thickness of 0.4 nm is present on the end parts of the magnetic pinned layer (Hx=0.4 nm). Moreover, the deviations σ of the asymmetry of waveforms in Sample No. 2 through Sample No. 6 show as low values as not more than 10%, markedly demonstrating the effect of an oxidized film formed on the end parts of the magnetic pinned layer. This data show that the thickness of an oxidized film on the end parts of the magnetic pinned layer is preferably not less than 0.6 nm.

The deviation σ of the asymmetry of waveforms exceeded 10% in Sample No. 7 through Sample No. 12 though the oxidized film thickness Hx was not less than 0.6 nm on the end parts of the magnetic pinned layer. This may be because asymmetry of MR waveforms tends to increase, and therefore the oxidation treatment effect intended by the present invention cannot be achieved.

The graph in FIG. 14 shows that the MR ratio (%) sharply declines if the oxidized film thickness Hx (nm) exceeds 2.0 nm on the end parts of the magnetic pinned layer. This may be because excessive oxidation of the end parts of the magnetic pinned layer causes the magnetic moment of the magnetic pinned layer 30 to decrease, resulting in deterioration in the outputs of an element.

Based on the results as described above, the effect of the present invention is obvious. In other words, the thin film magnetic head according to the present invention is a thin film magnetic head having an MR element that has a magnetoresistive effect film formed by sequentially layering a magnetic pinned layer, a nonmagnetic layer and a free layer, and a pair of bias magnetic field application layers formed at the junction tapered parts, which are formed on both end parts of the magneto-resistive effect film in the width direction, via insulating layers; there exist MPL oxidized films having a thickness Hx (unit: nm) on the end parts of the abovementioned magnetic pinned layer at the junction tapered parts; there exist FL oxidized films having a thickness Hf (unit: nm) on the end parts of the abovementioned free layer at the junction tapered parts; and the constitution is such that the oxidized film thickness ratio (Hf/Hx) is not more than 0.5. Accordingly, a vertical bias magnetic field can efficiently be applied to the free layer from the bias magnetic field application layer. As a result, it is possible to achieve a thin film magnetic head that is large in the MR ratio, small in the value of deviation σ of the asymmetry of MR waveforms and superior in reliability of elements.

With respect to the industrial feasibility of the present invention, the present invention can be used in the industry of magnetic disk devices equipped with a magneto-resistive effect element for reading the magnetic intensity of magnetic recording media and the like as signals.

What is claimed is:

1. A thin film magnetic head comprising:
    a magneto-resistive (MR) effect element comprising:
        an MR effect film formed by sequentially layering a magnetic pinned layer, a nonmagnetic layer and a free layer; and
        a pair of bias magnetic field application layers formed at junction tapered parts formed on both end parts of the MR effect film in a width direction via insulating layers, wherein
    the free layer is configured to change its magnetization direction in accordance with an external magnetic field,
    a magnetization direction of the magnetic pinned layer is pinned, and
    the bias magnetic field application layers are configured to apply a vertical bias magnetic field to the free layer, wherein
    magnetic pinned layer oxidized films of thickness Hx (unit: nm) are disposed on end parts of the magnetic pinned layer at the junction tapered parts,
    free layer oxidized films of thickness Hf (unit: nm) are disposed on end parts of the free layer at the junction tapered parts, and
    the oxidized films are configured such that the thickness ratio (Hx/Hf) is not more than 0.5.

2. The thin film magnetic head of claim 1, wherein the thickness Hx (unit: nm) of the magnetic pinned layer oxidized film is in the range of 0.6~2 nm.

3. The thin film magnetic head of claim 2, wherein no free layer oxidized film substantially exists on the end parts of the free layer at the junction tapered parts.

4. The thin film magnetic head of claim 1, wherein a thickness of the bias magnetic field application layers is in the range of 12~20 nm.

5. The thin film magnetic head of claim 1, wherein the bias magnetic field application layers are configured of a Co system hard magnetic layer.

6. The thin film magnetic head of claim 1, wherein a thickness of the insulating layers is in the range of 1~10 nm.

7. A head gimbal assembly comprising:
    a slider comprising the thin film magnetic head of claim 1 and disposed in a manner of being opposed to a recording medium, and
    a suspension for elastically supporting the slider.

8. A magnetic disk device comprising:
    a slider comprising the thin film magnetic head of claim 1 and disposed in a manner of being opposed to a recording medium, and
    a positioning device for supporting the slider and positioning the slider with respect to the recording medium.

9. A method of manufacturing the thin film magnetic head of claim 1 comprising:
    a multi-layered film body forming step of forming a multi-layered film body comprising an MR multi-layered film formed by sequentially layering a magnetic pinned layer, a nonmagnetic layer and a free layer on a substrate;
    a mask pattern forming step of forming a resist mask with a predetermined shape by exposing and developing a resist after the resist is formed on the multi-layered film body;
    an ion milling step of forming junction tapered parts in the width direction of the multi-layered film body by ion milling the multi-layered film body using the resist mask;
    a magnetic pinned layer end part oxidation treatment step of irradiating oxygen-containing beams to the film surface at a predetermined angle so that magnetic pinned layer oxidized films can be formed on end parts of the magnetic pinned layer, which is provided beneath the nonmagnetic layer, at the junction tapered parts using a residual resist mask after the ion milling step; and
    a step of forming a pair of bias magnetic field application layers on both end parts of the junction tapered parts via insulating layers in order to apply a vertical bias magnetic field to the free layer.

10. The method of manufacturing the thin film magnetic head of claim 9, wherein two types of resists are formed with two layers in the mask pattern forming step, and a first resist that is formed first has a higher etching rate against a developing liquid than a second resist that is formed later.

11. The method of manufacturing the thin film magnetic head of claim 9, wherein components composing the multi-layered film body are deposited on a surface of the residual resist mask after the ion milling step.

12. The method of manufacturing the thin film magnetic head of claim 9, wherein the oxygen-containing beam in the magnetic pinned layer end part oxidation treatment step contains 5~16 vol. % of oxygen in inert gas.

13. The method of manufacturing the thin film magnetic head of claim 9, wherein the oxygen-containing beam is irradiated to a film surface at 65~90 angles while a target to be irradiated rotates in the magnetic pinned layer end part oxidation treatment step.

* * * * *